United States Patent
Batra et al.

(10) Patent No.: US 6,627,492 B2
(45) Date of Patent: Sep. 30, 2003

(54) METHODS OF FORMING POLISHED MATERIAL AND METHODS OF FORMING ISOLATION REGIONS

(75) Inventors: Shubneesh Batra, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 56 days.

(21) Appl. No.: 09/808,705

(22) Filed: Mar. 14, 2001

(65) Prior Publication Data

US 2001/0021568 A1 Sep. 13, 2001

Related U.S. Application Data

(63) Continuation of application No. 09/320,404, filed on May 26, 1999, now Pat. No. 6,204,149.

(51) Int. Cl.$^7$ .......................................... H01L 21/8238
(52) U.S. Cl. ...................... 438/221; 438/296; 438/424; 438/431; 438/435; 438/692
(58) Field of Search ................... 438/221, 296, 438/424, 426, 431, 435, 437, 692; 257/506, 510

(56) References Cited

U.S. PATENT DOCUMENTS

| | | | |
|---|---|---|---|
| 4,656,497 A | * | 4/1987 | Roger et al. ................ 357/50 |
| 4,769,340 A | * | 9/1988 | Chang et al. ............... 437/52 |
| 5,387,539 A | | 2/1995 | Yang et al. |
| 5,435,888 A | | 7/1995 | Kalnitsky et al. |
| 5,459,096 A | | 10/1995 | Venkatesan et al. |
| 5,665,202 A | | 9/1997 | Subramanian et al. |
| 5,728,621 A | * | 3/1998 | Zhang et al. ............... 438/427 |
| 5,735,335 A | * | 4/1998 | Gilmore et al. ............ 164/516 |
| 5,759,913 A | * | 6/1998 | Fulford et al. ............. 438/624 |
| 5,817,567 A | | 10/1998 | Jang et al. |
| 5,834,358 A | | 11/1998 | Pan et al. |
| 5,872,045 A | | 2/1999 | Lou et al. |
| 5,904,539 A | | 5/1999 | Hause et al. |
| 5,915,190 A | | 6/1999 | Pirkle |
| 5,920,792 A | * | 7/1999 | Lin .......................... 438/633 |
| 5,923,993 A | | 7/1999 | Sahota |
| 5,930,646 A | | 7/1999 | Gerung et al. |

OTHER PUBLICATIONS

S. Wolf, Silicon Processing for the VLSI Era, vol. 2—Process Integration (Published by Lattice Press, Copyright 1990) (pp. 229–232).

U.S. patent application Ser. No. 09/146,730, Moore et al., filed Sep. 03, 1998.

* cited by examiner

Primary Examiner—William David Coleman
Assistant Examiner—Hsien Ming Lee
(74) Attorney, Agent, or Firm—Wells St. John P.S.

(57) ABSTRACT

In one aspect, the invention encompasses a method of forming a polished material. A substrate is provided and an elevational step is provided relative to the substrate. The elevational step has an uppermost surface. A material is formed beside the elevational step. The material extends to above the elevational step uppermost surface and has lower and upper layers. The lower layer polishes at slower rate than the upper layer under common polishing conditions. The lower layer joins the upper layer at an interface. The material is polished down to about the elevational level of the elevational step uppermost surface utilizing the common polishing conditions. In another aspect, the invention encompasses a method of forming an isolation region. A substrate is provided. The substrate has an opening extending therein and a surface proximate the opening. A material is formed within the opening. The material extends to above the substrate surface, and comprises a lower layer and an upper layer. The lower layer is more dense than the upper layer, and joins the upper layer at an interface that extends to at or below an elevational level of the substrate surface. The material is polished at least down to about the elevational level of the substrate surface.

15 Claims, 7 Drawing Sheets

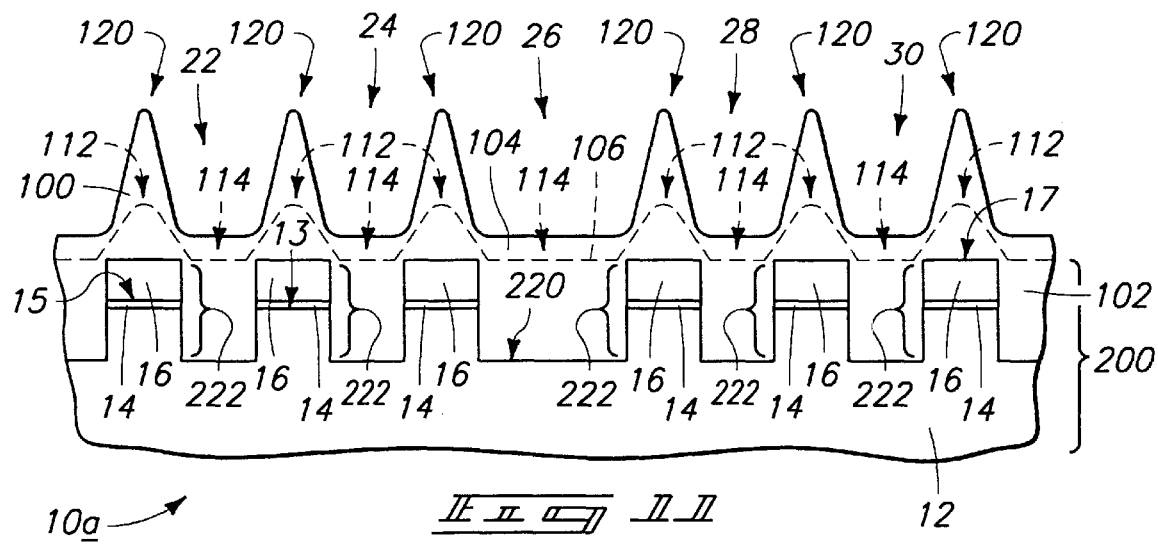
_FIG. 11_
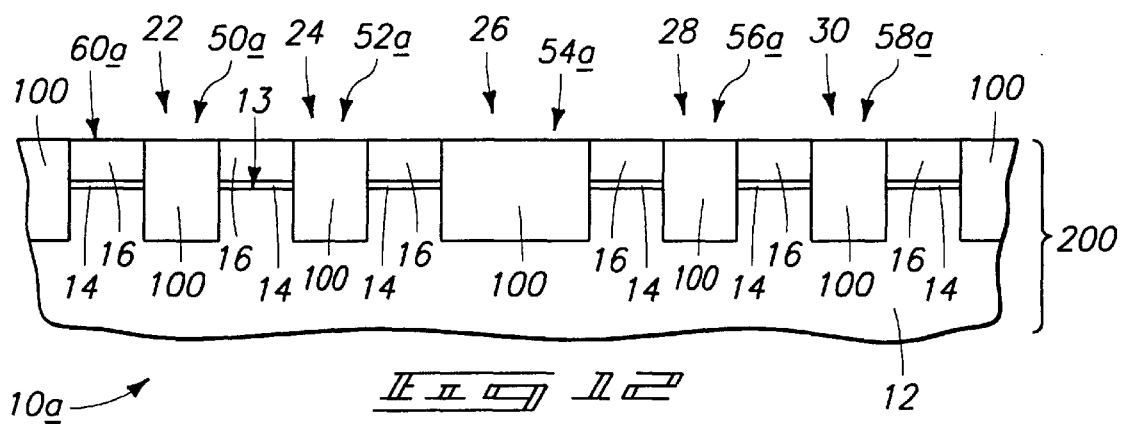
_FIG. 12_
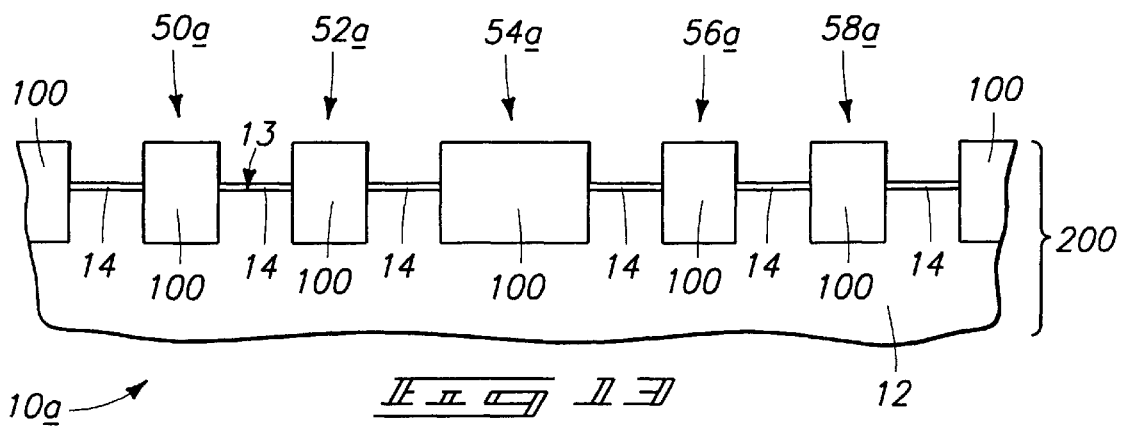
_FIG. 13_

METHODS OF FORMING POLISHED MATERIAL AND METHODS OF FORMING ISOLATION REGIONS

RELATED PATENT DATA

This patent resulted from a continuation application of U.S. application Ser. No. 09/320,404, filed May 26, 1999, entitled "Methods of Forming Polished Material And Methods of Forming Isolation Regions," naming Shubneesh Batra et al. as inventors, and which is now U.S. Pat. No. 6,204,149, the disclosure of which is incorporated by reference herein.

TECHNICAL FIELD

The invention pertains to methods of forming polished material, such as, for example, methods of forming isolation regions.

BACKGROUND OF THE INVENTION

In modern semiconductor device applications, millions of individual devices are packed onto a single small area of a semiconductor substrate, and many of these individual devices may need to be electrically isolated from one another. One method of accomplishing such isolation is to form a trenched isolation region between adjacent devices. Such trenched isolation region will generally comprise a trench or cavity formed within the substrate and filled with an insulative material, such as silicon dioxide.

A prior art method for forming trench isolation regions is described with reference to FIGS. 1–10. Referring to FIG. 1, a semiconductive wafer fragment 10 is shown at a preliminary stage of a prior art processing sequence. Wafer fragment 10 comprises a semiconductive material 12 having an upper surface 13. A layer of silicon dioxide 14 is formed over upper surface 13, and a layer of silicon nitride 16 is formed over silicon dioxide 14. A patterned masking layer 18 is formed over silicon nitride 16.

Substrate 12 can comprise, for example, monocrystalline silicon lightly doped with a conductivity enhancing material. For purposes of interpreting this document and the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Silicon dioxide layer 14 has a typical thickness of about 90 Å, nitride layer 16 has a typical thickness of from about 700 Å to about 800 Å, and masking layer 18 has a typical thickness of about 10,000 Å. Nitride layer 16 comprises a lower surface 15 and an upper surface 17. Patterned masking layer 18 can comprise, for example, photoresist.

Referring to FIG. 2, a pattern is transferred from layer 18 to nitride layer 16 and oxide layer 14 to form masking blocks 20 over substrate 12. Blocks 20 are separated by intervening openings (also referred to as trenches or gaps) 22, 24, 26, 28 and 30. Gaps 22, 24, 26, 28 and 30 define locations wherein isolation regions will ultimately be formed. In the shown typical embodiment, gaps 22, 24, 26, 28 and 30 vary in width, with gap 26 representing a wide trench. The variation in width of gaps 22, 24, 26, 28 and 30 is a matter of discretion for persons fabricating devices over substrate 12. Such variation in width is shown to exemplify how particular problems associated with polishing processes (the problems are discussed below) become exaggerated at wider trench openings.

Referring to FIG. 3, openings 22, 24, 26, 28 and 30 are extended into substrate 12. The processing of FIGS. 2 and 3 typically occurs in a single etch step.

Referring to FIG. 4, photoresist material 18 (FIG. 3) is removed. Subsequently, an insulative material 40 is provided to fill the trenches 22, 24, 26, 28 and 30. Insulative material 40 typically comprises silicon dioxide, and can be formed by, for example, high density plasma deposition. The term "high density" as used in this document to refer to a deposition plasma means a deposition plasma having a density of greater than $10^{10}$ ions/cm$^3$. The outer surface of the deposited insulative material 40 comprises surface peaks 42 (which actually have a three-dimensional pyramid shape) extending over the patterned nitride material 16. Peaks 42 result as an aspect of high density plasma deposition.

Referring to FIG. 5, wafer fragment 10 is subjected to a polishing process to remove insulative material 40 from over nitride layer 16, and to thereby remove peaks 42 (FIG. 4) and polish the insulative material 40 down to about even with an upper surface of nitride 16. After the polishing process, insulative material 40 forms isolation regions 50, 52, 54, 56 and 58 within openings 22, 24, 26, 28 and 30, respectively. The isolation regions and silicon nitride layer 16 comprise a coextensive upper surface 60. Upper surface 60 can be at about a same elevational level as original upper surface 17 (FIG. 1) of nitride layer 16, or can be below such elevational level, depending on whether the polishing process has removed any of the material of silicon nitride layer 16. Generally, the polishing process removes some of silicon nitride layer 16, but will slow significantly upon reaching silicon nitride layer 16 such that silicon nitride layer 16 effectively functions as an etch stop layer to define an end point of the polishing process. Exemplary polishing processes include chemical-mechanical polishing, as well as dry and wet etches selective for silicon dioxide relative to silicon nitride. In particular applications, insulative material 40 comprises silicon dioxide and is polished down to a level that is above the upper surface of the silicon nitride. The material 40 is then brought to about level with the upper surface of the silicon nitride with a subsequent wet acid (hydrofluoric acid) dip.

Ideally, upper surface 60 will be substantially planar. However, as shown a problem frequently occurs during the polishing of insulative material 40 wherein concavities 62 occur at the top of isolation regions 50, 52, 54, 56 and 58. Such problem is commonly referred to as "dishing." The problem is frequently more severe at wider isolation regions, corresponding to wider trenches, (i.e., isolation region 54) than at narrower isolation regions (i.e., isolation regions 50, 52, 56 and 58). The dishing can become particularly pronounced for isolation regions having widths greater than or equal to about 5 microns.

Referring to FIGS. 6 and 7, nitride layer 16 (FIG. 5) is removed, and subsequently pad oxide 14 is stripped. The stripping of pad oxide layer 14 can be accomplished with a hydrofluoric acid dip. Such dip also removes some of the silicon oxide from isolation regions 50, 52, 54, 56, and 58, and accordingly reduces a height of the oxide in such isolation regions.

Referring to FIG. 8, a sacrificial silicon dioxide layer 19 is formed over substrate 12. Such sacrificial silicon dioxide layer can be grown from silicon of substrate 12, or deposited over substrate 12.

Referring to FIG. 9, sacrificial silicon dioxide layer 19 is stripped from over substrate 12. The stripping of sacrificial silicon dioxide layer 19 can be accomplished with a hydrofluoric acid dip. Such dip also removes some of the silicon oxide from isolation regions 50, 52, 54, 56, and 58, and accordingly reduces a height of the oxide in such isolation regions.

Referring to FIG. 10, a gate oxide layer 21 is formed over substrate 12. Such gate oxide layer can be grown from silicon of substrate 12, or deposited over substrate 12. It is noted that only pertinent processing steps are discussed in describing FIGS. 8–10, and that additional processing steps (in addition to those discussed) can occur between the forming of the sacrificial oxide layer and the forming of the gate oxide layer.

As shown in FIG. 10, the dishing described with reference to FIG. 5 can remain in isolation regions 50, 52, 54, 56 and 58 after the processing of FIGS. 6–10, and can result in at least some of the isolation regions having portions below an elevational level of the upper surface of substrate 12. The dishing also causes the isolation regions to have corners 70 which are not right angles. Such corners 70 can undesirably affect operating voltages of devices formed proximate isolation regions 50, 52, 54, 56 and 58, and can, for example, result in non-uniformity of threshold voltages for such devices. It would therefore be desirable to develop alternative methods of forming isolation regions.

SUMMARY OF THE INVENTION

In one aspect, the invention encompasses a method of forming a polished material. A substrate is provided and an elevational step is provided relative to the substrate. The elevational step has an uppermost surface. A material is formed beside the elevational step. The material extends to above the elevational step uppermost surface and has lower and upper layers. The lower layer polishes at slower rate than the upper layer under common polishing conditions. The lower layer joins the upper layer at an interface. The material is polished down to about the elevational level of the elevational step uppermost surface utilizing the common polishing conditions.

In another aspect, the invention encompasses a method of forming an isolation region. A substrate is provided. The substrate has an opening extending therein and a surface proximate the opening. A material is formed within the opening. The material extends to above the substrate surface, and comprises a lower layer and an upper layer. The lower layer is more dense than the upper layer, and joins the upper layer at an interface that extends to at or below an elevational level of the substrate surface. The material is polished at least down to about the elevational level of the substrate surface.

BRIEF DESCRIPTION OF THE DRAWINGS

Preferred embodiments of the invention are described below with reference to the following accompanying drawings.

FIG. 11 is a schematic, fragmentary, cross-sectional view of a semiconductive wafer fragment in process according to a method of the present invention. The wafer fragment of FIG. 11 is shown at a processing step subsequent to that of prior art FIG. 3.

FIG. 12 shows the FIG. 11 wafer fragment at a processing step subsequent to that of FIG. 11.

FIG. 13 shows the FIG. 11 wafer fragment at a processing step subsequent to that of FIG. 12.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

An exemplary embodiment of the invention is described with reference to a semiconductive wafer fragment 10a in FIGS. 11–17 as a method of forming field isolation regions. However, it is to be understood that the invention has applications beyond formation of field isolation regions and can, for example, be applied generally to polishing processes. In referring to FIGS. 11–17, similar numbering to that utilized above in describing the prior art will be used, with differences indicated by the suffix "a", or by different numerals.

Figure 3:
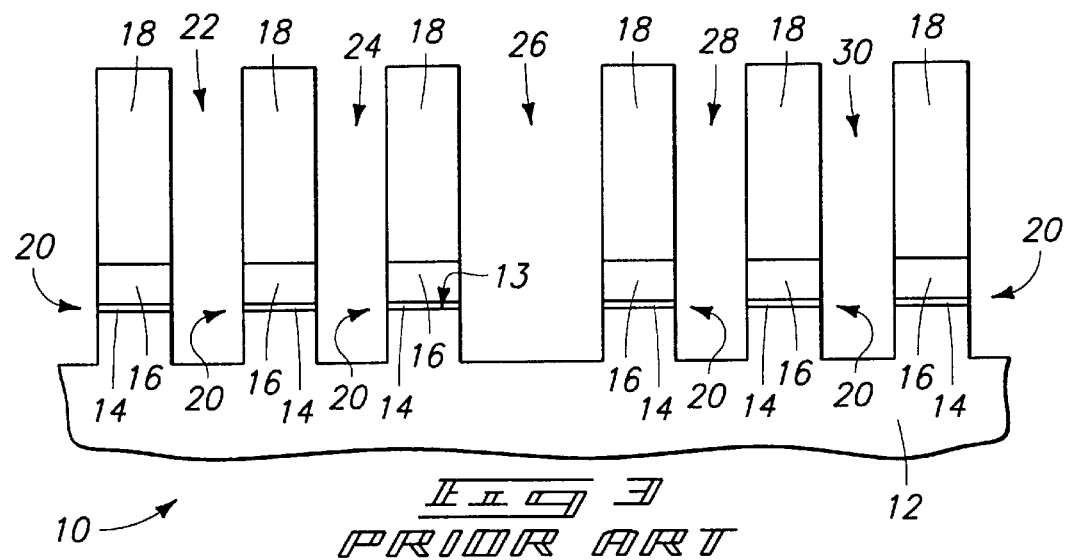
FIG. 3 shows the FIG. 1 wafer fragment at a prior art processing step subsequent to that of FIG. 2.
Figure 4:
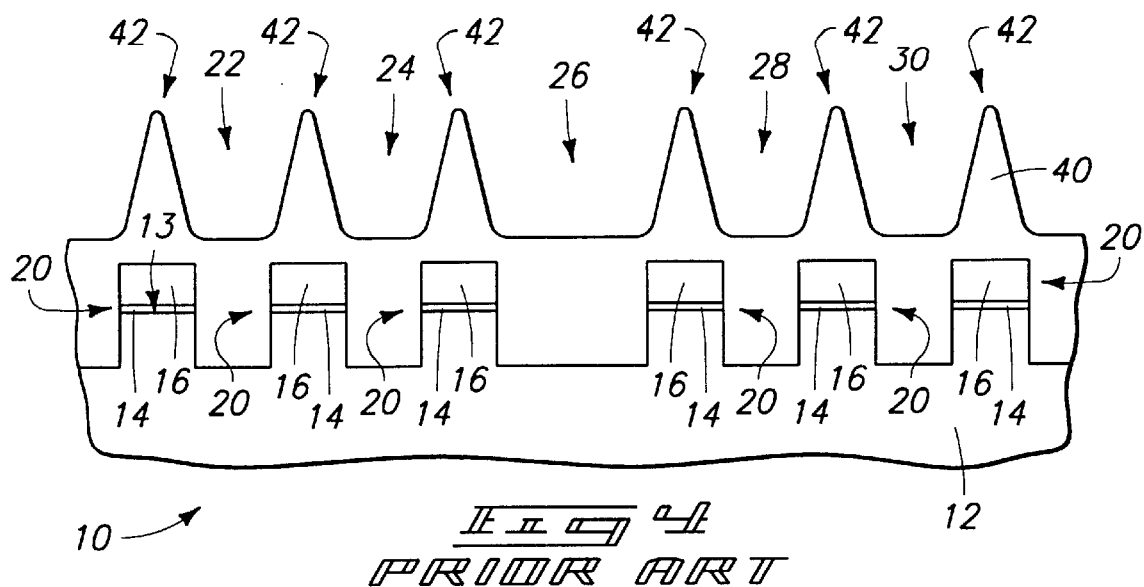
FIG. 4 shows the FIG. 1 wafer fragment at a prior art processing step subsequent to that of FIG. 3.
Figure 5:
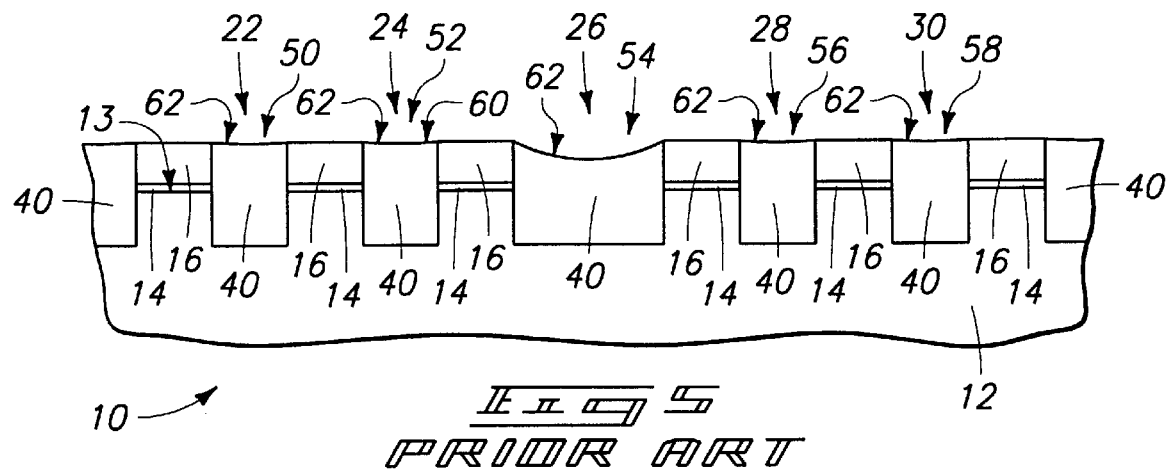
FIG. 5 shows the FIG. 1 wafer fragment at a prior art processing step subsequent to that of FIG. 4.

Referring to FIG. 11, semiconductive wafer fragment 10a is shown at a processing step subsequent to that of the step described above with reference to prior art FIG. 3. Semiconductive wafer fragment 10a comprises a substrate 12 over which a silicon dioxide layer 14 and a silicon nitride layer 16 are provided. Silicon nitride layer 16 can be referred to herein as an etchstop layer. Openings 22, 24, 26, 28 and 30 extend through layers 14 and 16 and into substrate 12. An insulative material 100 is formed over substrate 12 and within openings 22, 24, 26, 28 and 30. It is noted that wafer fragment 10a of FIG. 11 is shown at a processing step similar to that of wafer fragment 10 of FIG. 4. However, wafer fragment 10a of FIG. 11 differs from the wafer fragment 10 of FIG. 4 in that insulative material 100 comprises two distinct layers (or regions) 102 and 104, whereas insulative material 40 (FIG. 4) comprises only a single layer.

Layers 102 and 104 of insulative material 100 join at an interface 106 which is indicated by a dashed line, and differ from one another in that layer 102 comprises a different density than layer 104. Preferably, the lower layer (layer 102) is denser than the upper layer (layer 104). Interface 106 preferably extends from above silicon nitride layer 16 to at or below an elevational level of upper surface 17 of silicon nitride layer 16. Interface 106 comprises uppermost portions 112 and lowermost portions 114. Preferably, lowestmost portions 114 are elevationally at a level that is at least about as high as an elevational level of upper surface 13 of substrate 12, and no higher than an elevational level of upper surface 17 of silicon nitride layer 16. However, it is to be understood that in particular embodiments such lowermost portions 114 can be above the elevational level of upper surface 17 of nitride layer 16.

Layers 102 and 104 can comprise a common material, with the only difference between layers 102 and 104 being the difference in density. For instance, layers 102 and 104 can both comprise high density plasma deposited silicon dioxide. The difference in density can be expressed as a different in wet etch rate. For instance, in a preferred embodiment, the denser lower layer 102 will etch in a wet oxide etch at a rate that is from about 1 times the etch rate of thermal oxide to about 1.3 times the etch rate of thermal oxide. In contrast, the less dense upper layer 104 will etch in a wet oxide etch at a rate that is from about 1.5 times the etch rate of thermal oxide to about 2.5 times the etch rate of thermal oxide. The described wet etch can comprise dilute HF (i.e., 300:1 water:hydrofluoric acid), at room temperature. It is to be understood that the above-described wet etch rates are merely methods of quantitating the relative densities of layers 102 and 104, and do not imply that the layers are subjected to a wet etch in methods of the present invention.

An exemplary method of forming high density plasma deposited silicon dioxide having a first layer 102 formed to be a higher density silicon dioxide than a second layer 104 is as follows. Initially, first layer 102 is formed utilizing a high density plasma, a pressure of from 0.1 mTorr to about 1 Torr, and a power of from about 1,000 watts to about 3,000 watts, with the power representing both radio frequency and bias. The reaction occurs in a deposition chamber into which silane is flowed at a rate of from about 50 standard cubic centimeters per minute (sccm) to about 150 sccm, with a preferred flow rate of about 100 sccm. Oxygen ($O_2$) is flowed into the chamber at a rate of from about 50 sccm to about 150 sccm, with a preferred rate of about 100 sccm, and argon is flowed into the chamber at a rate of from about 400 sccm to about 600 sccm, with a preferred rate of about 500 sccm. Substrate 12 is maintained at a temperature of from about 500° C. to about 700° C., and preferably about 600° C., by flowing helium against a backside of substrate 12. After formation of layer 102 to a desired depth, the temperature of the wafer is dropped to less than or equal to 400° C. (preferably to from about 300° C. to about 400° C.) and second layer 104 is deposited. The temperature can be dropped by increasing a flow of helium against a backside of substrate 12.

Insulative material 100 comprises peaks 120 over silicon nitride layer 16, and valleys over openings 22, 24, 26, 28 and 30. In accordance with one aspect of the invention, it is recognized that material 100 polishes faster from peaks 120 than from lower regions due to a lesser volume of material to polish. Also, it is recognized that the portion of material 100 comprised by denser layer 102 will generally polish at a slower rate than the less dense portion of material 100 comprised by layer 104. Accordingly, as material 100 is subjected to a polishing process the initially faster polishing rate of peaks 120, combined with the relatively faster polishing rate of layer 104 relative to layer 102, can result in planarity occurring at an upper surface of material 100 during the polishing process. The elevational location of the upper surface of material 100 at which such planarity is achieved can be adjusted by one or more of (1) altering the elevational location of interface 106; and (2) altering the relative density of portions 102 and 104. Preferably, planarity of the upper surface of material 100 occurs when the upper surface of material 100 coincides to at or about lower portion 114 of interface 106. Alternatively, such planarity can occur when the upper surface of material 100 is about even with upper surface 17 of nitride layer 16.

FIG. 12 illustrates wafer fragment 10a after being subjected to a polishing process. Wafer fragment 10a comprises a plurality of isolation regions 50a, 52a, 54a, 56a and 58a, each of which contains insulative material 100. Wafer fragment 10a further comprises a substantially planar upper surface 60a which is coextensive across an upper surface of silicon nitride layer 16 and upper surfaces of isolation regions 50, 52a, 54a, 56a and 58a. In the shown preferred embodiment, upper surface 60a is at or about an elevational level of lower portions 114 (FIG. 11) of interface 106 (FIG. 11). Accordingly, isolation regions 50a, 52a, 54a, 56a and 58a comprise primarily the higher density silicon dioxide of layer 102 (FIG. 11), rather than the lower density silicon dioxide of layer 104 (FIG. 11). Such incorporation of primarily higher density silicon dioxide can eliminate a high density plasma densification anneal utilized for treating isolation regions formed in accordance with the prior art.

Although the above described planarization was accomplished utilizing layers 102 and 104 (FIG. 11) which differed in density, it will be appreciated that such can be generally accomplished utilizing layers 102 and 104 which differ in polishing rate under common polishing conditions. By "common polishing conditions" it is meant conditions which are identical with respect to both of layers 102 and 104. Accordingly, the term "common polishing conditions" encompasses procedures in which both of layers 102 and 104 are exposed to the same polish at the same time, as well as procedures wherein the compositions of layers 102 and 104 are exposed to identical polishing conditions at different times. The description of layers which "differ in polishing rate under common polishing conditions" is used herein to describe relative physical properties of layers 102 and 104, and does not indicate particular polishing procedures applied to layers 102 and 104.

Figure 14:
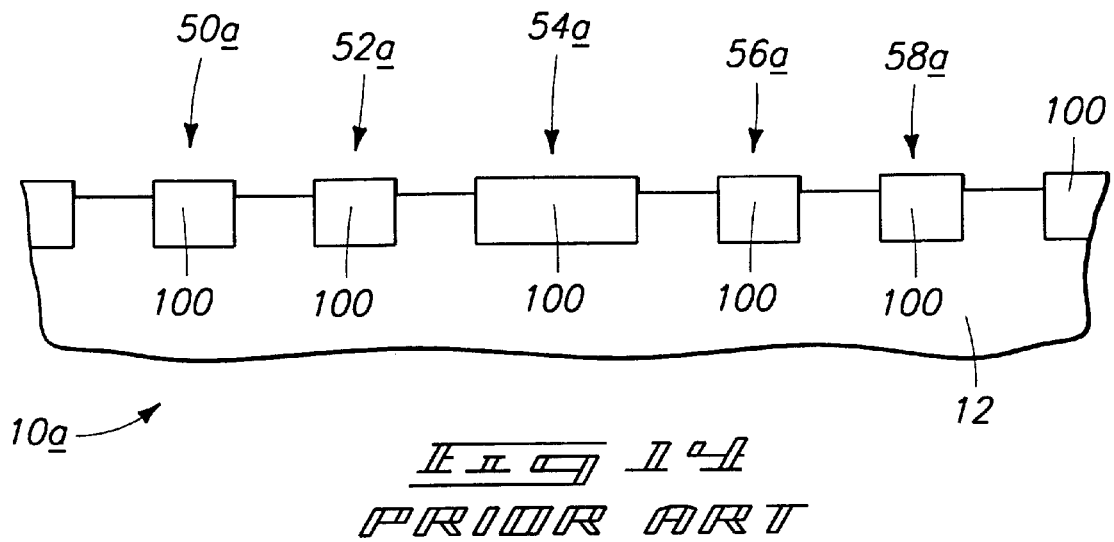
FIG. 14 shows the FIG. 11 wafer fragment at a processing step subsequent to that of FIG. 13.

Referring to FIGS. 13 and 14, nitride layer 16 (FIG. 12) is removed, and subsequently pad oxide 14 is stripped. The stripping of pad oxide layer 14 can be accomplished with a hydrofluoric acid dip. Such dip also removes some of the silicon oxide from isolation regions 50a, 52a, 54a, 56a, and 58a, and accordingly reduces a height of the oxide in such isolation regions.

Figure 15:
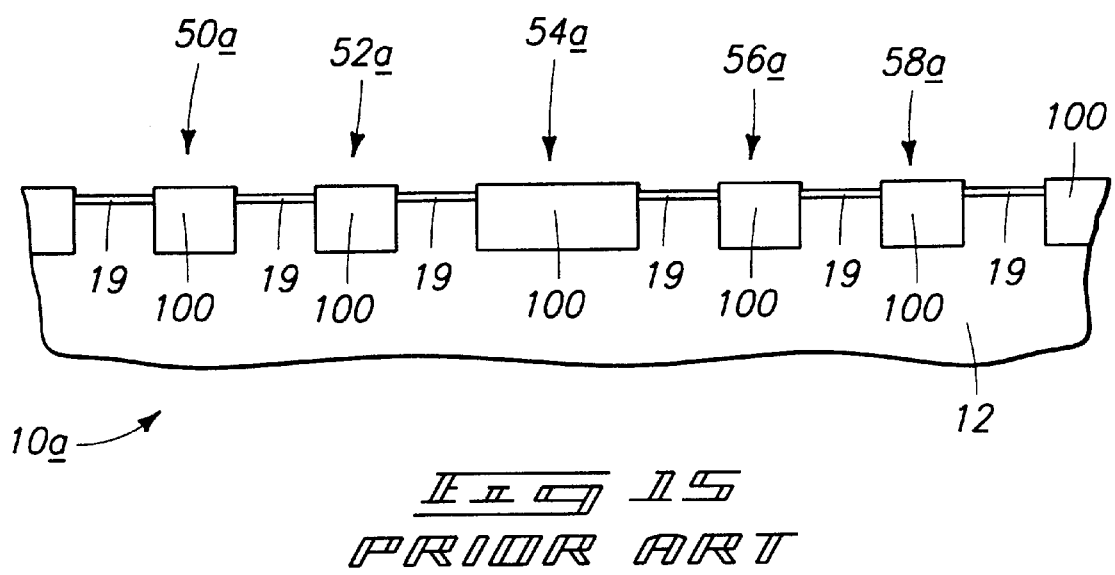
FIG. 15 shows the FIG. 11 wafer fragment at a processing step subsequent to that of FIG. 14.

Referring to FIG. 15, a sacrificial silicon dioxide layer 19 is formed over substrate 12. Such sacrificial silicon dioxide layer can be grown from silicon of substrate 12, or deposited over substrate 12.

Figure 16:
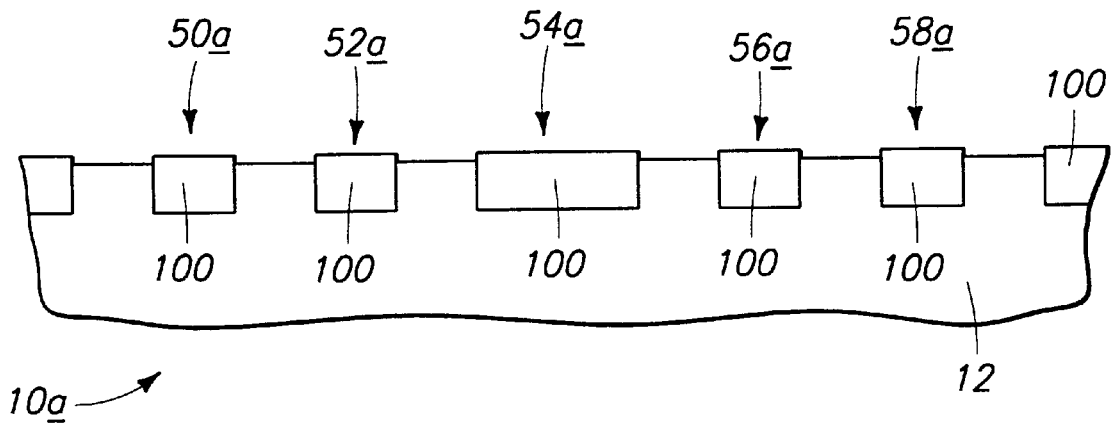
FIG. 16 shows the FIG. 11 wafer fragment at a processing step subsequent to that of FIG. 15.

Referring to FIG. 16, sacrificial silicon dioxide layer 19 (FIG. 15) is stripped from over substrate 12. The stripping of sacrificial silicon dioxide layer 19 can be accomplished with a hydrofluoric acid dip. Such dip also removes some of the silicon oxide from isolation regions 50a, 52a, 54a, 56a, and 58a, and accordingly reduces a height of the oxide in such isolation regions.

Figure 17:
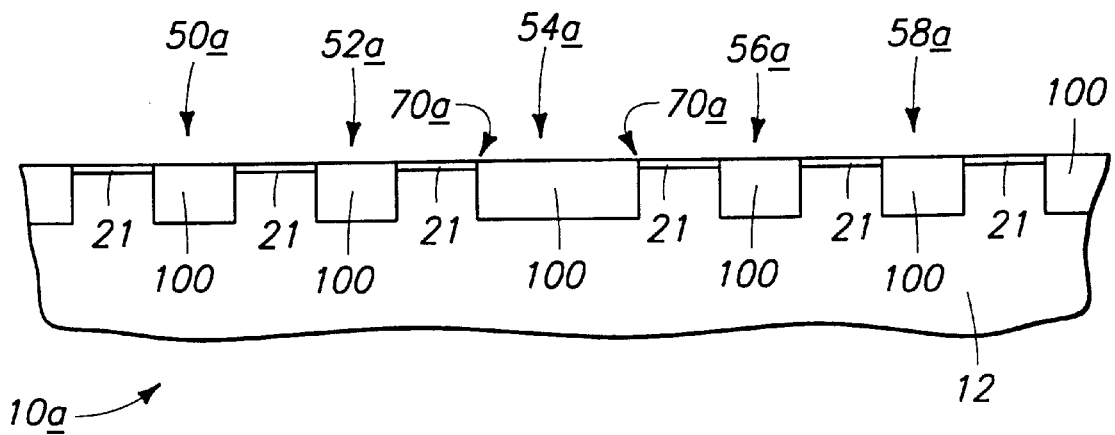
FIG. 17 shows the FIG. 11 wafer fragment at a processing step subsequent to that of FIG. 16.

Referring to FIG. 17, a gate oxide layer 21 is formed over substrate 12. Such gate oxide layer can be grown from silicon of substrate 12, or deposited over substrate 12. Isolation regions 50a, 52a, 54a, 56a and 58a of FIG. 17 have corners 70a which, unlike the corners 70 of the prior art construction (FIG. 10), are substantially right angles.

The terminology utilized above in describing FIGS. 11–17 is but one of many ways in which a method of the present invention can be described. For instance, the above description referred to the bulk mass labeled 12 as a substrate, and to the masses labeled 14 and 16 as layers over the substrate 12. An alternative method of describing the same structure is presented with reference to FIG. 11. In such alternative method, masses 12, 14 and 16 together comprise a substrate 200. Substrate 200 has an upper surface 17 coincident with a surface of silicon nitride layer 16.

Yet another alternative method of describing the embodiment of FIGS. 11–17 is as follows, and is described with reference to FIG. 11. First, it is recognized that openings 22, 24, 26, 28 and 30 have a periphery bounded by bottom surfaces 220. Steps 222 are then defined between bottom surfaces 220 and upper surface 17 of silicon nitride layer 16. Steps 222 can be referred to as elevational steps formed relative to a substrate, and comprising uppermost surfaces corresponding to surface 17. In the shown embodiment, steps 222 comprise substantially vertical sidewalls. Material 100 is formed proximate steps 222 and extends to above the elevational step uppermost surfaces 17. Interface 106 extends to at or below an elevational level of the elevational step uppermost surfaces 17.

In this alternative method of description, the processing of FIG. 12 can be referred to as polishing material 100 down to about the elevational level of the elevational step uppermost surface 17, or, in alternative embodiments, as polishing the material down to about the elevational level of interface 106.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an isolation region, comprising:
   providing a substrate having an opening extending therein, the substrate having a surface proximate the opening;
   forming a material within the opening and extending to above the substrate surface, the material comprising a lower layer and an upper layer, the lower layer being more dense than the upper layer, the lower layer joining the upper layer at an interface that extends to at or below an elevational level of the substrate surface;
   polishing the material at least down to about the elevational level of the substrate surface; and
   wherein the upper and lower layers comprise silicon dioxide and are formed by plasma deposition; the lower layer being formed while maintaining a temperature of the substrate at from about 500° C. to about 700° C., and the upper layer being formed while maintaining a temperature of the substrate at from about 300° C. to about 400° C.

2. The method of claim 1 wherein the upper and lower layers consist essentially of the same chemical composition.

3. The method of claim 1 wherein the upper and lower layers comprise silicon dioxide.

4. The method of claim 1 wherein the material is formed to extend over the substrate surface, and wherein the polishing removes the material from over the substrate surface.

5. The method of claim 1 wherein the interface extends to below the elevational level of the substrate surface.

6. The method of claim 1 wherein the substrate comprises a silicon nitride layer over monocrystalline silicon, wherein the opening extends through the silicon nitride layer and into the monocrystalline silicon, and wherein the substrate surface is a surface of the silicon nitride layer.

7. The method of claim 1 further comprising providing a patterned layer intermediate the substrate surface and the material, the patterned layer having an uppermost surface over the substrate surface, and wherein the polishing comprises at least two polishing steps:
   a first polishing step removing the material to the uppermost surface; and
   a second polishing step removing the patterned layer to the substrate surface.

8. The method of claim 1 wherein the lower and upper layers comprise high density plasma deposited silicon dioxide.

9. A method of forming an isolation region, comprising:
   providing a bulk monocrystalline silicon substrate;
   forming a patterned layer over the substrate, the patterned layer defining an opening over the substrate and comprising an upper surface proximate the opening;
   extending the opening into the substrate;
   forming a material within the opening and extending to above the patterned layer upper surface, the material comprising a lower layer and an upper layer, the lower layer being more dense than the upper layer, the lower layer joining the upper layer at an interface that extends to at or below an elevational level of the upper surface;
   polishing the material at least down to about the elevational level of the upper surface; and
   wherein the upper and lower layers comprise silicon dioxide and are formed by plasma deposition; the lower layer being formed while maintaining a temperature of the substrate at from about about 500° C. to about 700° C., and the upper layer being formed while maintaining a temperature of the substrate at from about 300° C. to about 400° C.

10. The method of claim 9 wherein the patterned layer comprises silicon nitride, the silicon nitride of the patterned layer being separated from the monocrystalline silicon by a layer of silicon dioxide.

11. The method of claim 9 wherein the material is formed to extend over the patterned layer upper surface, and wherein the polishing removes the material from over the patterned layer upper surface.

12. The method of claim 9 wherein the upper and lower layers comprise silicon dioxide.

13. The method of claim 9, wherein the interface extends to below the elevational level of the patterned layer upper surface.

14. The method of claim 9 wherein the polishing comprises removing the material to the elevational level of the upper surface.

15. The method of claim 9 wherein the lower and upper layers comprise high density plasma deposited silicon dioxide.

* * * * *

UNITED STATES PATENT AND TRADEMARK OFFICE
CERTIFICATE OF CORRECTION

PATENT NO.    : 6,627,492 B2  
DATED         : September 30, 2003  
INVENTOR(S)   : Shubneesh Batra et al.

Figure 1:
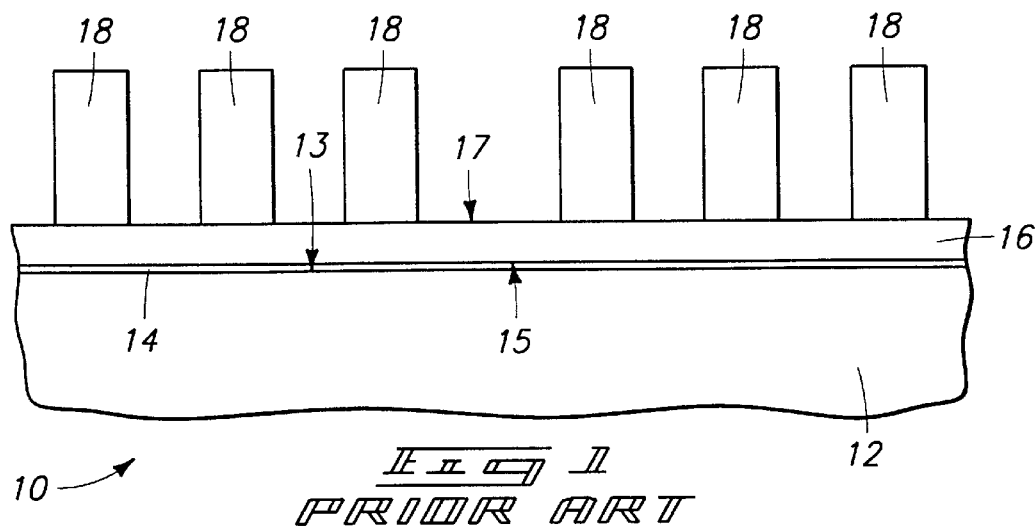
FIG. 1 is a schematic, cross-sectional, fragmentary view of a semiconductor wafer fragment at a preliminary processing step in accordance with a prior art processing sequence.
Figure 2:
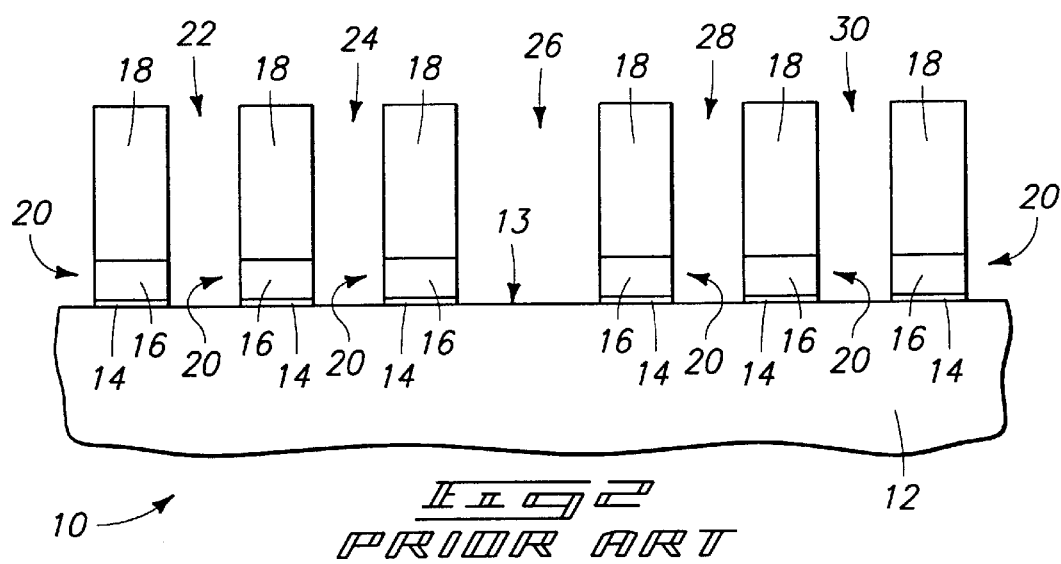
FIG. 2 shows the FIG. 1 wafer fragment at a prior art processing step subsequent to that of FIG. 1.
Figure 6:
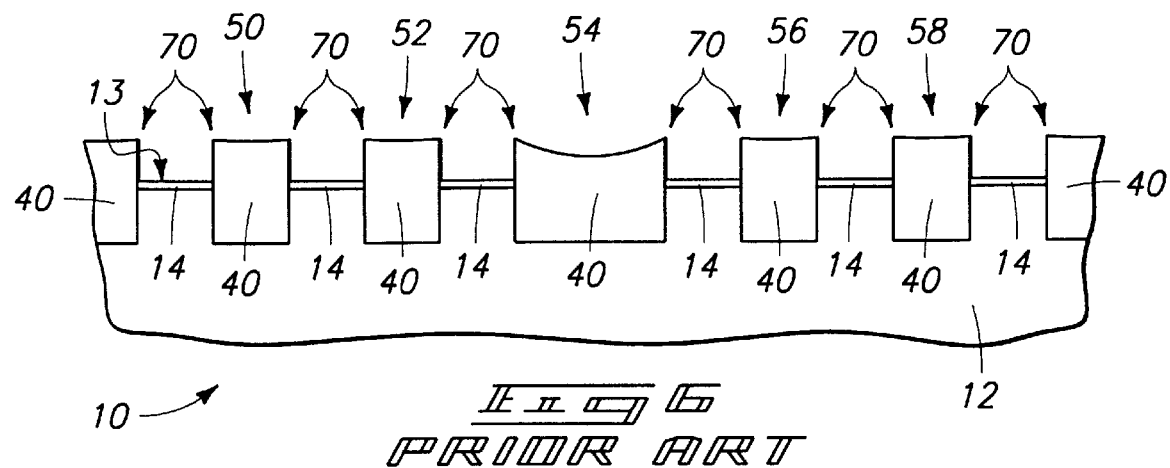
FIG. 6 shows the FIG. 1 wafer fragment at a prior art prior art processing step subsequent to that of FIG. 5.
Figure 7:
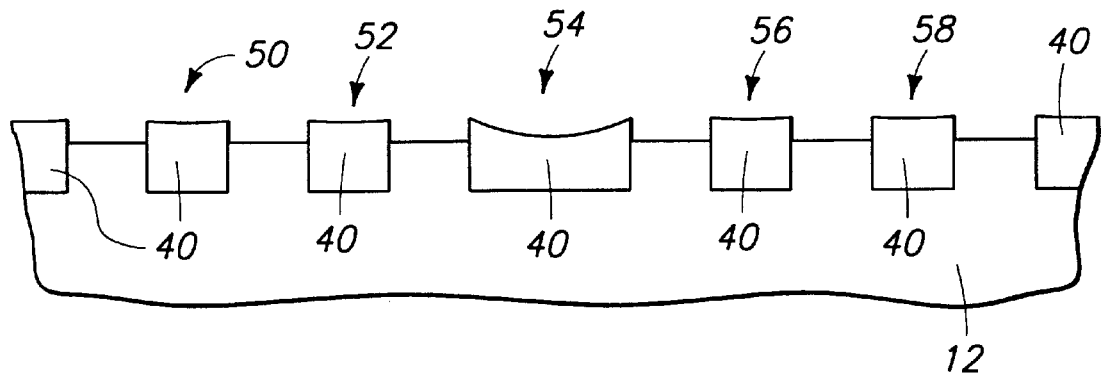
FIG. 7 shows the FIG. 1 wafer fragment at a prior art prior art processing step subsequent to that of FIG. 6.
Figure 8:
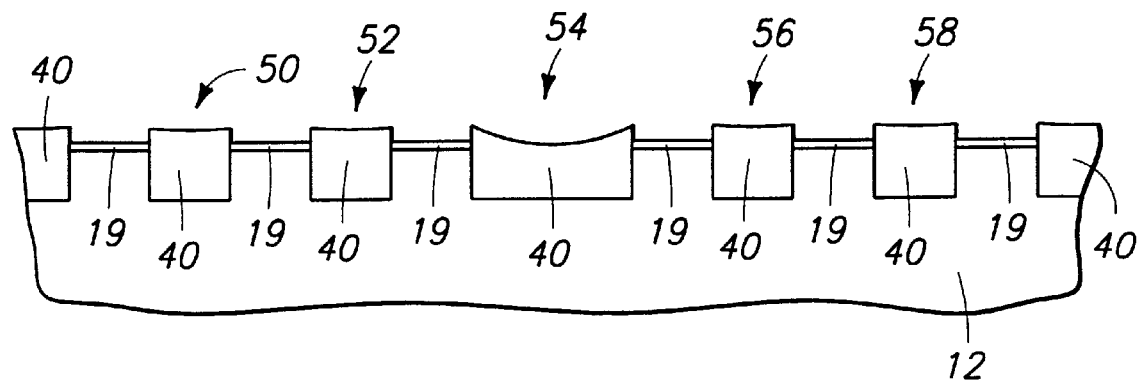
FIG. 8 shows the FIG. 1 wafer fragment at a prior art prior art processing step subsequent to that of FIG. 7.
Figure 9:
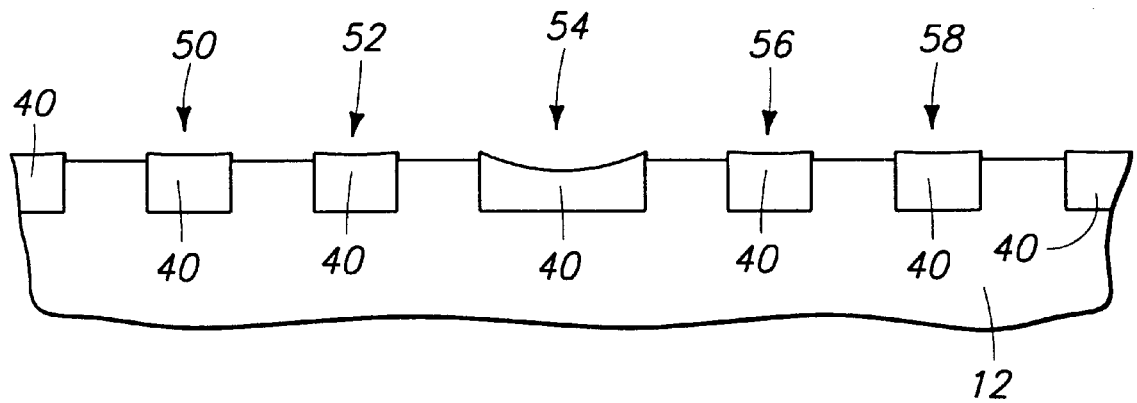
FIG. 9 shows the FIG. 1 wafer fragment at a prior art prior art processing step subsequent to that of FIG. 8.
Figure 10:
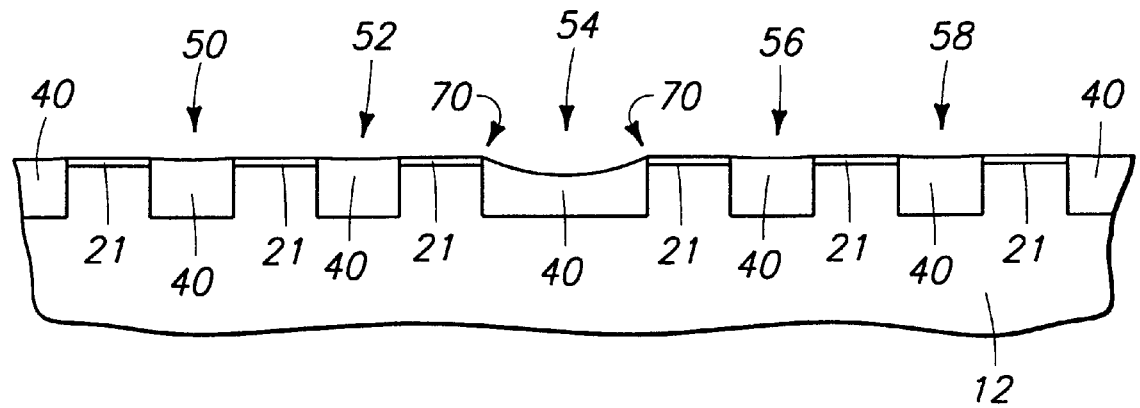
FIG. 10 shows the FIG. 1 wafer fragment at a prior art prior art processing step subsequent to that of FIG. 9.

It is certified that error appears in the above-identified patent and that said Letters Patent is hereby corrected as shown below:

Column 4,
Lines 5-6, replace "FIG. 6 shows the FIG.1 wafer fragment at a prior art prior art processing step" with -- FIG 6 shows the FIG. 1 wafer fragment at a prior art processing step --
Lines 7-8, replace "FIG. 7 shows the FIG.1 wafer fragment at a prior art prior art processing step" with -- FIG 7 shows the FIG. 1 wafer fragment at a prior art processing step --
Lines 9-10, replace "FIG. 8 shows the FIG.1 wafer fragment at a prior art prior art processing step" with -- FIG 8 shows the FIG. 1 wafer fragment at a prior art processing step --
Lines 11-12, replace "FIG. 9 shows the FIG.1 wafer fragment at a prior art prior art processing step" with -- FIG 9 shows the FIG. 1 wafer fragment at a prior art processing step --
Lines 13-14, replace "FIG. 10 shows the FIG.1 wafer fragment at a prior art prior art processing step" with -- FIG 10 shows the FIG. 1 wafer fragment at a prior art processing step --

Column 5,
Line 22, replace "different in wet etch rate. For instance, in a preferred" with -- difference in wet etch rate. For instance, in a preferred --

Column 6,
Line 23, replace "regions 50, 52a, 54a, 56a, and 58a. In the shown preferred" with -- regions 50a, 52a, 54a, 56a, and 58a. In the shown preferred --

Signed and Sealed this

Twenty-third Day of March, 2004

JON W. DUDAS
*Acting Director of the United States Patent and Trademark Office*